United States Patent [19]

Takeda

[11] Patent Number: 4,540,895
[45] Date of Patent: Sep. 10, 1985

[54] DEVICE HAVING THYRISTORS CONNECTED IN SERIES

[75] Inventor: Masatoshi Takeda, Hyogo, Japan

[73] Assignee: Mitsubishi Denki Kabushiki Kaisha, Tokyo, Japan

[21] Appl. No.: 492,490

[22] Filed: May 6, 1983

[51] Int. Cl.³ .............................................. H03K 17/72
[52] U.S. Cl. ................................... 307/252 Q; 363/57
[58] Field of Search ............ 307/252 N, 252 Q, 252 T, 307/252 W; 363/53, 54, 57, 58, 68

[56] References Cited

U.S. PATENT DOCUMENTS

| 3,715,606 | 2/1973 | Travin et al. | 307/252 Q |
| 3,865,438 | 2/1975 | Boksjo et al. | 363/54 |
| 4,016,391 | 4/1977 | Kiuchi et al. | 363/54 |
| 4,377,835 | 3/1983 | Asplund et al. | 363/54 |

Primary Examiner—John Zazworsky
Attorney, Agent, or Firm—Bernard, Rothwell & Brown

[57] ABSTRACT

A device comprising a series circuit consisting of a plurality of thyristors connected in series, and a reverse-blocking semiconductor element such as a diode connected in an antiparallel relationship to the series circuit. The device further includes means for detecting whether a sufficient turn-off time is secured for each of the thyristors anterior or posterior to a reference moment at the zero point of a current flowing in the diode, and means for turning on the entirety of the thyristors when the sufficient turn-off time is not secured. Since none of the thyristors is turned off in the state where the turn-off time is insufficient, it becomes possible with certainty to achieve exact prevention of a fault that one or more thyristors, turned off earlier than others are led to breakdown by an overvoltage.

5 Claims, 14 Drawing Figures

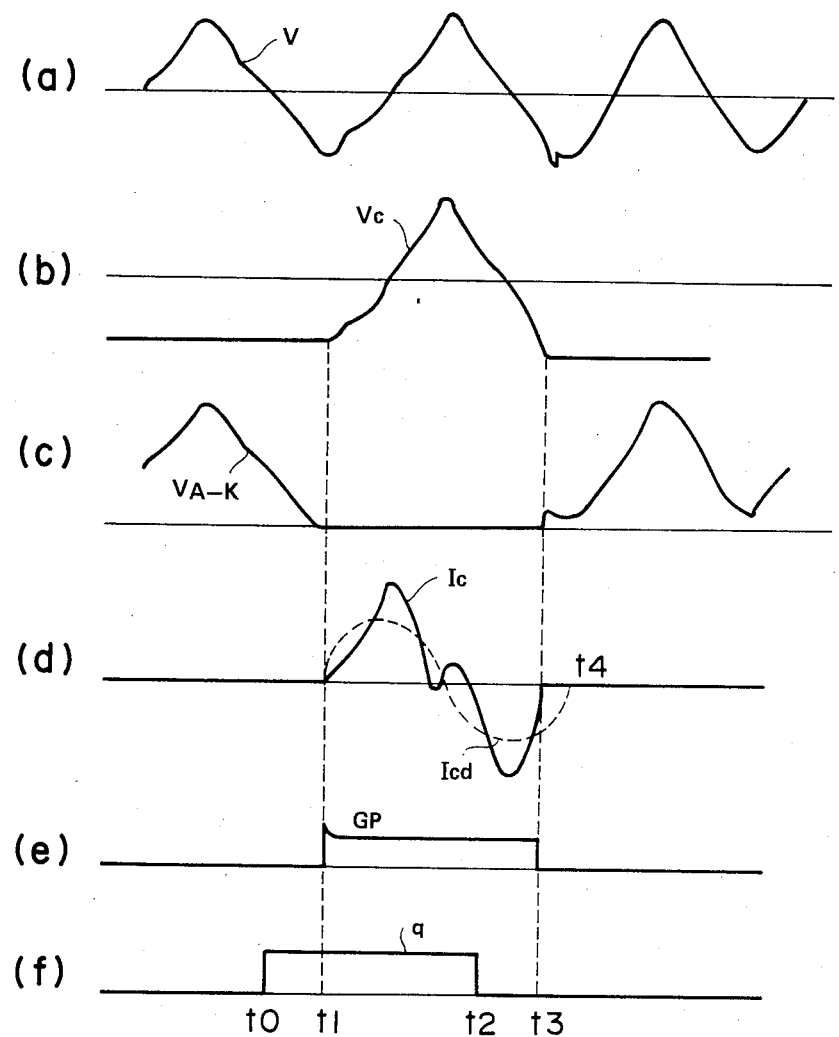

DEVICE HAVING THYRISTORS CONNECTED IN SERIES

BACKGROUND OF THE INVENTION

1. Field of the Invention

The present invention relates to a device equipped with series connected thyristors and adapted for use as a reactive power compensator or the like.

FIG. 1 shows a conventional reactive power compensator as an example of this type, wherein there are included an AC power source 1 for supplying a voltage V, a power source impedance 2, an inductive load 3, a reactive power compensator 4, a phase advance capacitor 5, a current controller 6 consisting of a diode 7 and a thyristor 8 which are so connected as to constitute an antiparallel circuit, a voltage transformer 9, a current transformer 10, a reactive power detector 11, and a gate signal generator 12. The reactive power detector 11 serves to detect a reactive power Q out of a circuit voltage $V_R$ obtained from the voltage transformer 9 and a circuit current $I_R$ obtained from the current transformer 10 and, upon increase of the detected reactive power Q to a preset value, feeds a capacitor output command signal q to the gate signal generator 12. As shown in FIG. 3, the gate signal generator 12 comprises a timing pulse generator 121, an inverter 122, AND elements 123a and 123b, and a signal generator 124. The timing pulse generator 121 receives the output $V_R$ of the voltage transformer 9 shown in FIG. 1 and, as illustrated in FIG. 5, produces a gate-on command pulse $P_{ON}$ synchronously with the negative maximum value of the output $V_R$ and also a gate-off command pulse $P_{OFF}$ after delay of a predetermined time To therefrom. And both the pulse $P_{ON}$ and the capacitor output command signal q are fed to the AND circuit 123a, while the pulse $P_{OFF}$ and the inverted capacitor output command signal q̄ obtained from the inverter 122 are fed to the AND circuit 123b. The gate signal generator 124 consists of a self-excited oscillator which, in response to an input signal received at its terminal A from the AND circuit 123a, feeds a wide-duration gate signal GP to the gate of the thyristor 8 and maintains such an action continuously until arrival of a signal at its terminal B from the AND circuit 123b.

FIG. 2 shows a current controller 6 employed when the main circuit of the device is of high-voltage type. This controller consists of a plurality of series connected diodes 7a, 7b and 7c and a plurality of series connected thyristors 8a, 8b and 8c. Also shown are pulse transformer 13 and demodulators 14a, 14b and 14c.

Hereinafter the operation of this device will be described with reference to the waveform charts of FIGS. 4 and 5.

Since the thyristor 8 remains in its off-state until arrival of the capacitor output command signal q, the phase advance capacitor 5 is charged at a potential equivalent to the negative maximum value $V_{max}$ of the voltage V, so that a voltage $V_{A-K}$ having a waveform of FIG. 4 (c) including both the supply voltage V and the output voltage $V_C$ of the capacitor 5 superposed thereon is applied between the anode and the cathode of the thyristor 8.

Supposing now that the capacitor output command signal q is produced at time $t_0$, the gate-on command signal $P_{ON}$ is not outputted despite application of the signal q to the gate signal generator 12 until time $t_1$ at which the supply voltage V reaches its negative maximum value, so that the gate signal GP is not generated either until arrival of time $t_1$. This circuit configuration is designed in such a manner as to prevent flow of a rush current from the phase advance capacitor 5 by placing the thyristor 8 in a conducting state when the voltage $V_{A-K}$ applied thereto is in the vicinity of its zero level. Upon generation of the gate signal GP, the thyristor 8 is turned on to permit flow of a capacitor current Ic of FIG. 4 via the phase advance capacitor 5, thereby compensating for the reactive power in the main circuit to improve the power factor thereof.

When the power factor is thus improved to reduce the reactive power below a predetermined value, the capacitor output command signal q comes to be extinct. But even after extinction of the signal q at time $t_2$ as shown, the capacitor current Ic still keeps flowing via the diode 7 until time $t_4$ at which the supply voltage V reaches its negative maximum value. For this reason, the gate-off command pulse $P_{OFF}$ is preset to have a duration shorter than one cycle of the supply voltage V by the turn-off time $T_{OFF}$ of the thyristor 8.

The above conventional device performs its operation as mentioned when the load 3 is an inductive one. However, in case the load 3 is a thyristor unit or the like, the waveform of the supply voltage V is distorted as shown in FIG. 6 due to higher harmonics included in the circuit current I, so that a distorted current comes to flow in the phase advance capacitor 5. An example of such distorted current is shown in FIG. 6 (d). If the time point, at which the current Icd flowing in the diode 7 (hereinafter referred to as diode current) becomes zero like the capacitor current Ic, deviates toward time $t_3$ of extinction of the gate signal GP in the case where the current controller 6 is equipped with series connected thyristors 8a, 8b and 8c as shown in FIG. 2, there may occur an undesired phenomenon that, for example, the thyristors 8a and 8b are turned off while the thyristor 8c fails to be turned off because of some variation in the turn-off characteristics of the individual thyristors. And with subsequent increase of the supply voltage V posterior to time $t_4$, the entire voltage comes to be applied to the thyristor 8c alone to eventually cause its withstand voltage breakdown. (Hereinafter this will be referred to as first case of withstand voltage breakdown.)

Furthermore, when the waveform of the capacitor current Ic is distorted as shown in FIG. 7 (d), i.e. in case the current flowing in the circuit of thyristors 8a, 8b and 8c at the time of extinction of the gate signal GP is commutated to the circuit of diodes 7a, 7b and 7c at time $t_{42}$ and then is blocked by the thyristors 8a, 8b and 8c at time $t_{43}$: the period from time $t_{42}$ to time $t_{43}$ is excessively short to fail in securing a sufficient turn-off time as a result, and due to the variation in the characteristics of the individual thyristors, there occurs a phenomenon that, e.g. the thyristor 8c alone is left in its on-state and is finally led to withstand voltage breakdown. (Hereinafter this will be referred to as second case of withstand voltage breakdown.)

SUMMARY OF THE INVENTION

It is an object of this invention to provide an improved device which is equipped with novel means capable of eliminating the aforesaid disadvantage through effective prevention of a fault that, at the time of turning off a plurality of thyristors connected in series, one or more thyristors alone are turned off prior to others because of the reason mentioned above and are thereby brought to breakdown by an overvoltage.

According to an exemplary embodiment of this invention, any thyristor having such characteristic that turn-off thereof happens earlier than others is protectable by feeding an ignition or turn-on signal to the gate of each of series connected thyristors in case the time required until a current flowing in a reverse-blocking semiconductor element connected in an antiparallel relationship to the said thyristor becomes zero is shorter than a predetermined time required for turning off the entire thyristors, hence avoiding an undesired phenomenon that only the thyristor of a shorter turn-off time is turned off.

According to another embodiment, such protection is executed by applying a gate signal again if the time between one zero point and the next of the current flowing in the reverse-blocking semiconductor element is shorter than the maximum turn-off time. In this case, satisfactory protection effect is attainable with certainty even when the current flowing in the antiparallel circuit has an oscillating waveform.

BRIEF DESCRIPTION OF THE DRAWINGS

FIGS. 4 through 7 show the voltage waveforms of signals in the device of FIG. 1;

DESCRIPTION OF THE PREFERRED EMBODIMENTS

Figure 1:
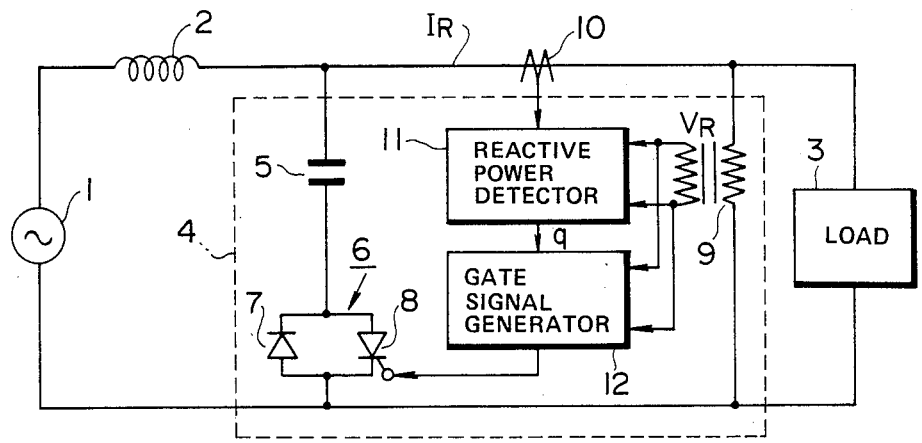
FIG. 1 is a block diagram of a conventional reactive power compensator.
Figure 2:
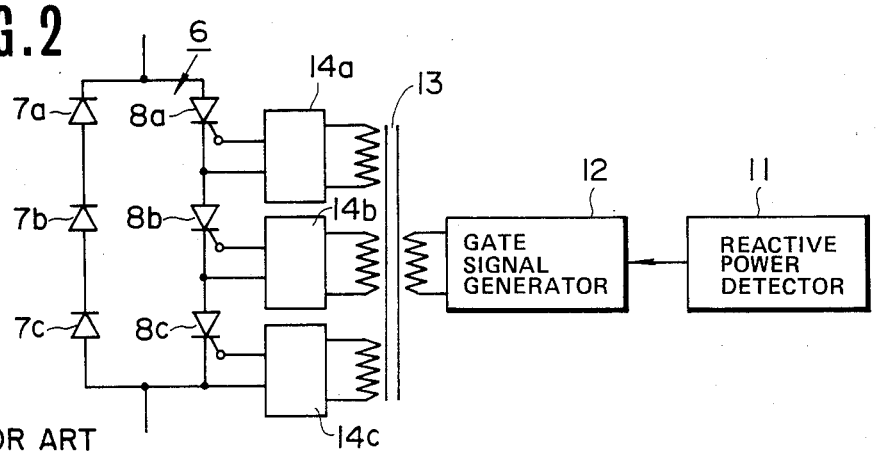
FIG. 2 is a circuit diagram of another current controller adapted for use in the device of FIG. 1.
Figure 3:
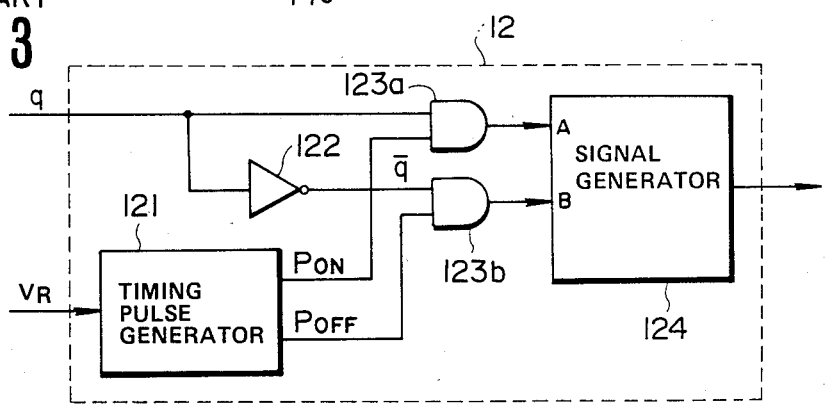
FIG. 3 is a block diagram showing details of a gate signal generator employed in the device of FIG. 1.
Figure 4:
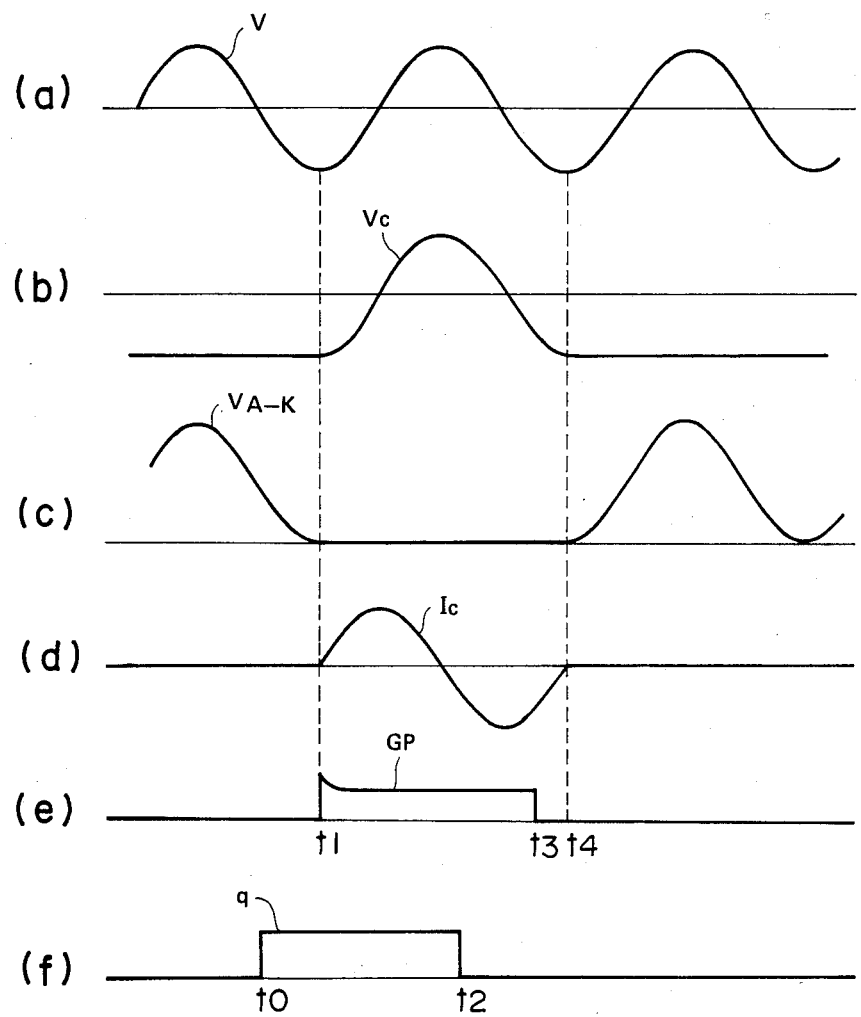
Figure 5:
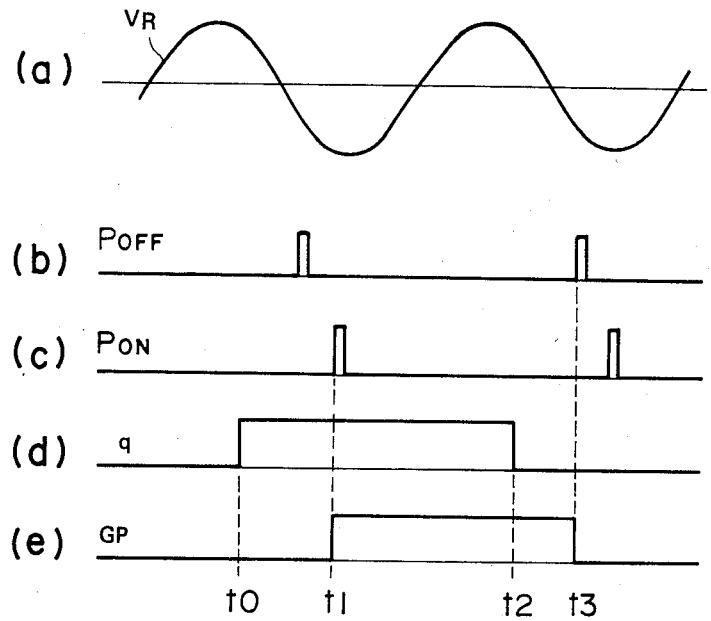
Figure 8:
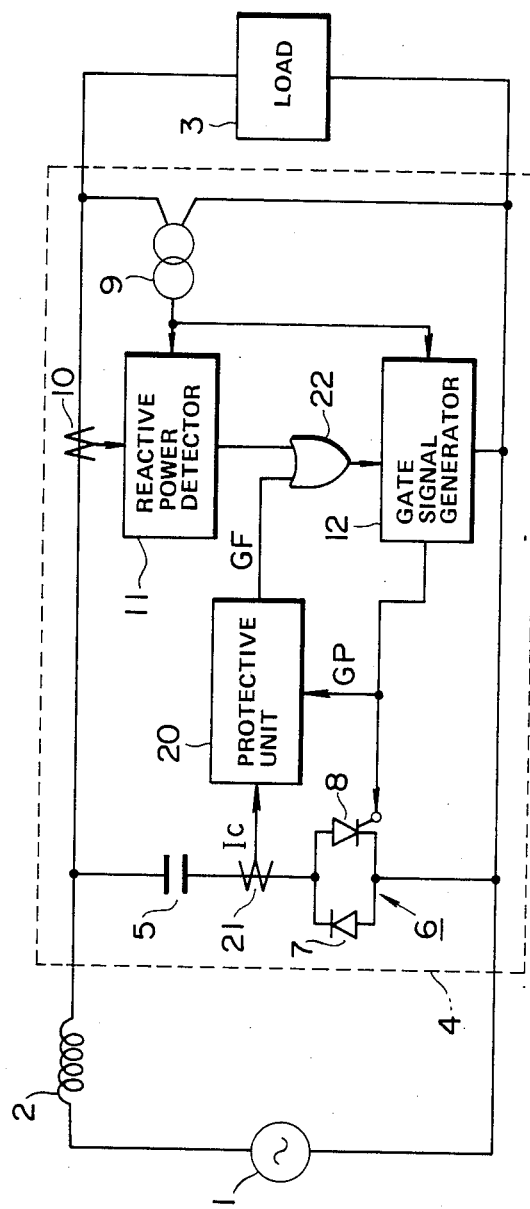
FIG. 8 is a block diagram of an exemplary embodiment of this invention having series connected thyristors.

Hereinafter an exemplary embodiment of the present invention will be described in detail with reference to the accompanying drawings. In FIG. 8, there are shown an AC power source 1 for providing a supply voltage V, a power source impedance 2, an inductive load 3, and a reactive power compensator 4. This compensator 4 comprises a phase advance capacitor 5, a current controller 6 consisting of a diode 7 and a thyristor 8 connected in an antiparallel relationship to each other, a voltage transformer 9, a current transformer 10, a reactive power detector 11, and a gate signal generator 12. Since these components are equivalent to those of FIG. 1 and the current controller 6 is structurally equal to the one shown in FIG. 2, the corresponding parts or portions are represented by the same reference numerals, and detailed explanation thereof is omitted here.

Figure 9:
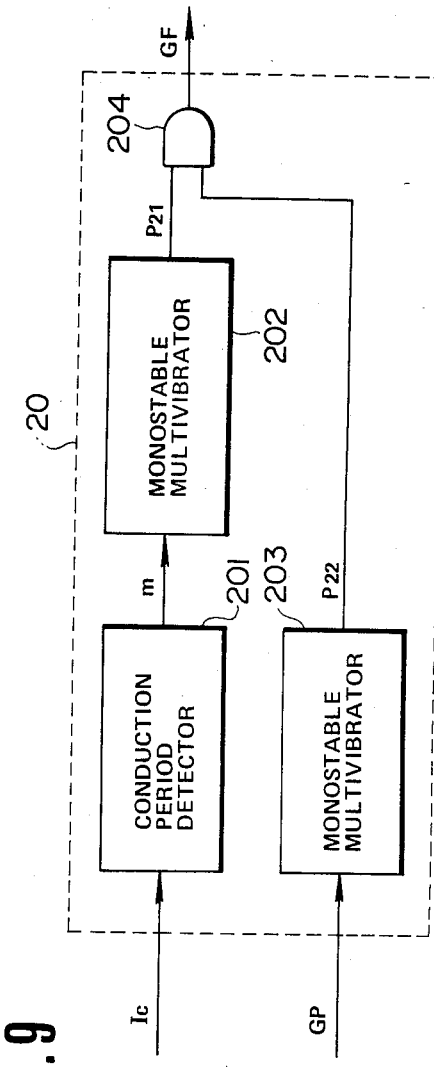
FIG. 9 shows the circuit construction of the protective unit shown in block diagram form in FIG. 8.
Figure 10:
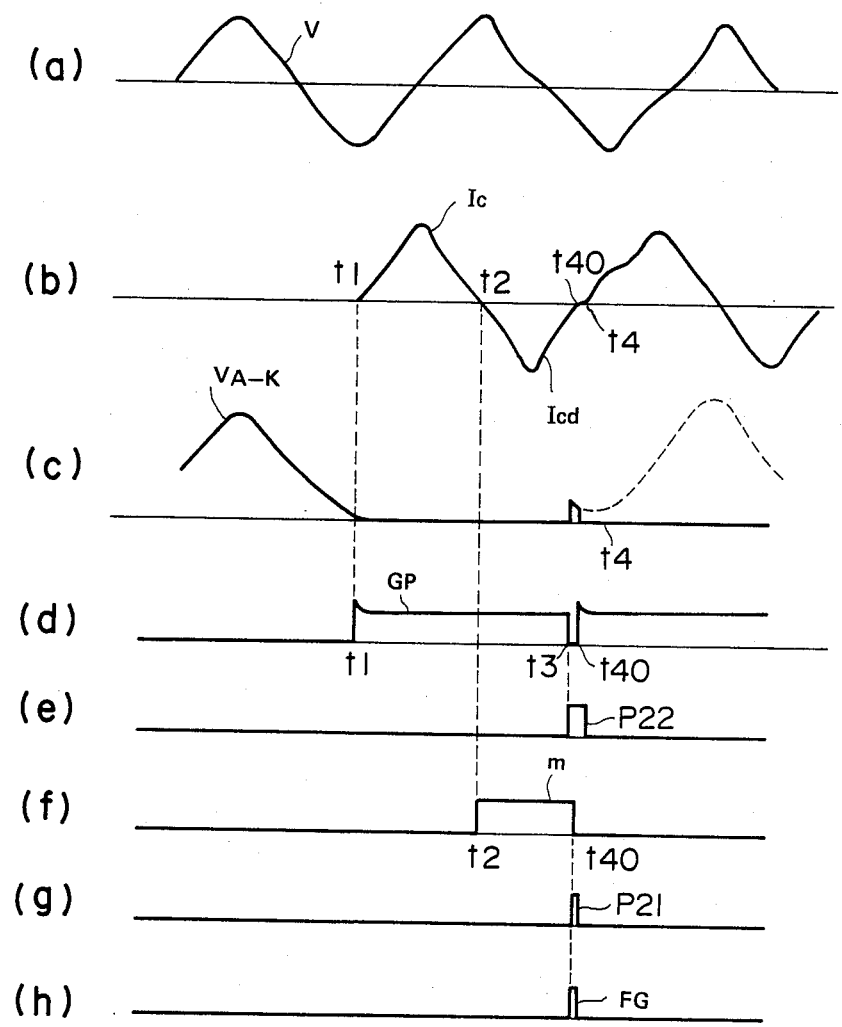
FIG. 10 shows the waveforms of signals in the device of FIG. 9.

A protective unit 20 has a circuit construction of FIG. 9 and functions to produce a reignition pulse GF in response to the output of a current transformer 21 which detects a capacitor current Ic flowing in the current controller 6, and also in response to a gate signal GP received from a gate signal generator 12. In FIG. 9, labeled as 201 is a conduction period detector which receives the output Ic of the current transformer 21 and, during the flow of the diode current Icd, feeds to a monostable multivibrator 202 a detection signal m having a voltage waveform of FIG. 10 (f). The monostable multivibrator 202 produces a zero detection pulse P21 synchronously with the fall of the detection signal m, and another monostable multivibrator 203 produces a pulse P22 synchronously with the fall of the gate signal GP. The pulse P22 has a duration corresponding to a turn-off time $T_{OFF}$ which is not shorter than the time from the beginning of extinction at time $t_3$ of the gate signal GP introduced to the gate of each of the thyristors 8a, 8b and 8c until the gate signal GP is again outputted at time $t_{40}$. A reference numeral 204 denotes an AND circuit to which the pulses P21 and P22 are fed. This circuit 204 produces the aforesaid reignition command pulse GF in response to simultaneous input of the two pulses. Subsequently, both the command pulse GF and the capacitor output command signal q are fed to the gate signal generator 12 via an OR circuit 22.

In this circuit construction, when the capacitor current Ic is distorted as described previously in connection with FIG. 6 and the diode current Icd becomes zero at time $t_{40}$ prior to increase of the supply voltage V to its maximum negative value after extinction of the gate signal GP, the reignition command signal FG is applied from the protective unit 20 via the OR circuit 22 to the gate signal generator 12 as long as the period from time $t_3$ to time $t_{40}$ is within the duration $T_{OFF}$ of the pulse 22, so that the gate signal GP is outputted again at time $t_{40}$. Consequently, the thyristors 8a, 8b and 8c are turned on again at time $t_{40}$ to completely prevent the aforesaid first case of withstand voltage breakdown. The waveform shown with a dotted line in FIG. 10 (c) represents a forward voltage applied to the series circuit of thyristors 8a–8c when they are not turned on again.

Figure 12:
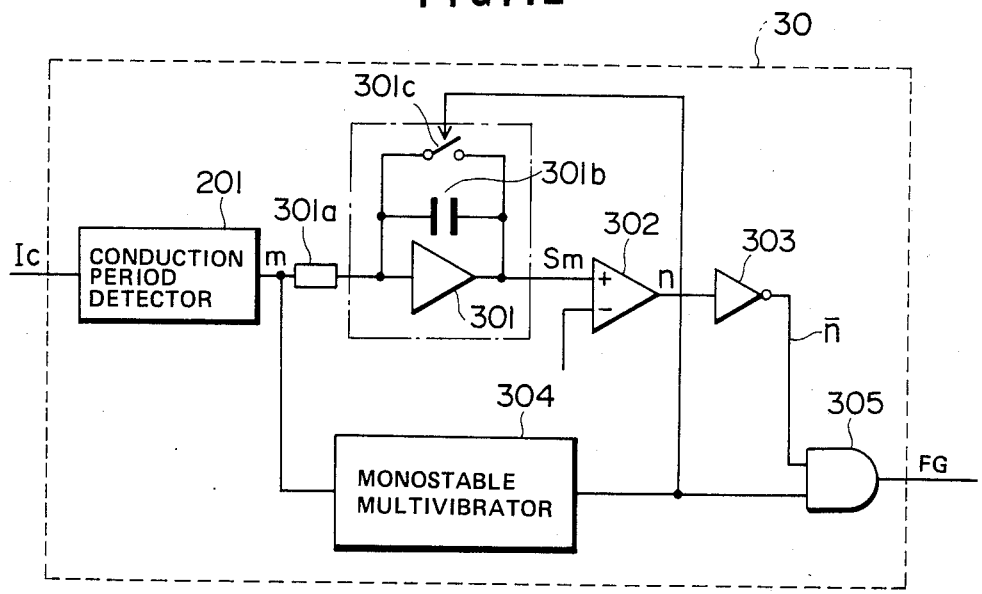
FIG. 12 is a block diagram showing further details of a protective unit employed in the device of FIG. 11.
Figure 7:
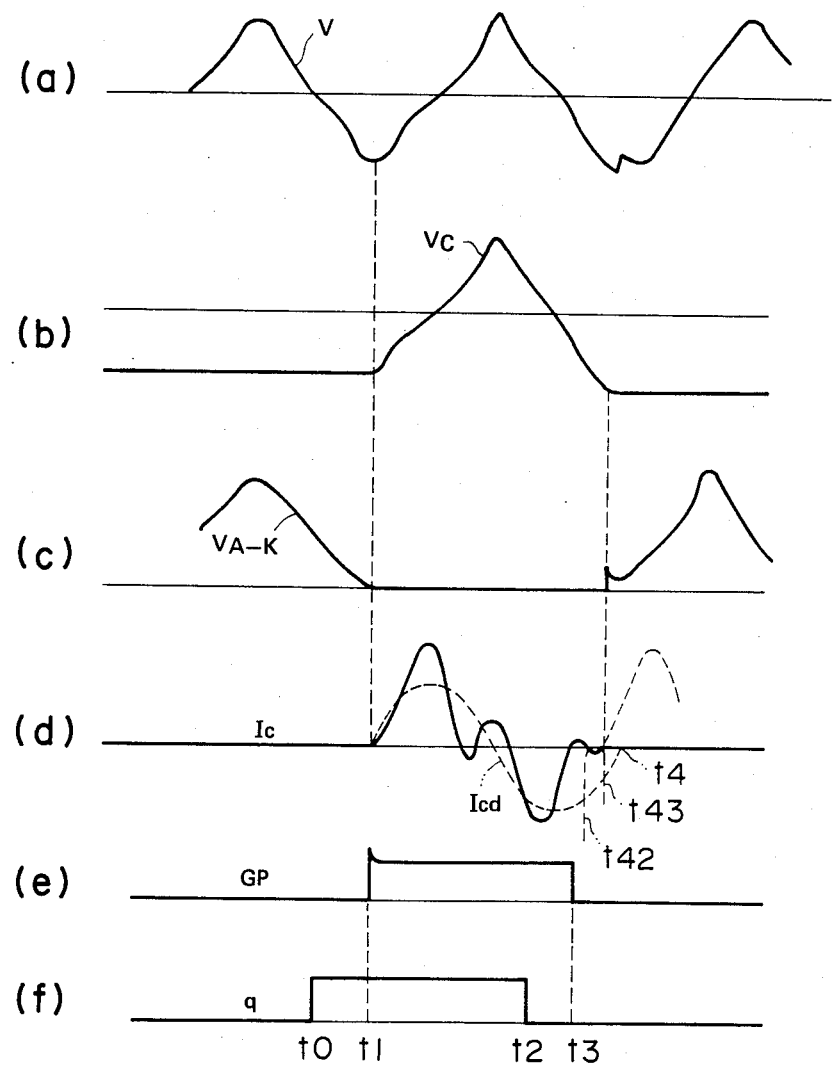
Figure 11:
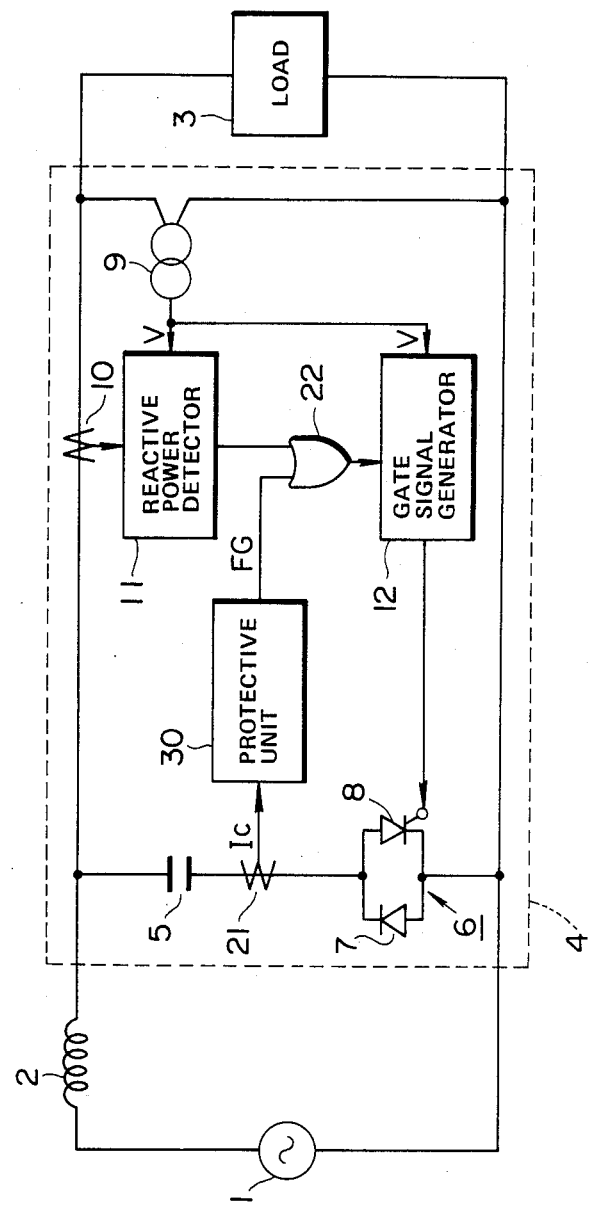
FIG. 11 is a block diagram of another embodiment of this invention having series connected thyristors.

FIG. 11 illustrates a second embodiment of the invention designed to prevent the second case of withstand voltage breakdown. A protective unit 30 has a circuit construction of FIG. 12, in which an integrator 301 receives a detection signal m from a conduction period detector 201 and feeds its output integral signal Sm to a comparator 302. There are also shown a resistor 301a, a capacitor 301b and a reset circuit 301c. The comparator 302 is so formed as to generate an output n of "1" level when the input increases beyond a reference level M corresponding to the turn-off time $T_{OFF}$. The output n thus produced is inverted by a NOT element 303 and then is fed to one input terminal of an AND element 305. A monostable multivibrator 304 receives the output detection signal m of the conduction period detector 201 and feeds a zero detection pulse P34, which is synchronized with the fall of the signal m, to the other input terminal of the AND element 305. In response to the two pulses $\overline{n}$ and P34, the AND element 305 produces a reignition command pulse FG, which is then fed together with the capacitor output command signal q via the OR element 22 to the gate signal generator 12. The other circuit configuration is exactly the same as that shown in FIG. 8.

Figure 13:
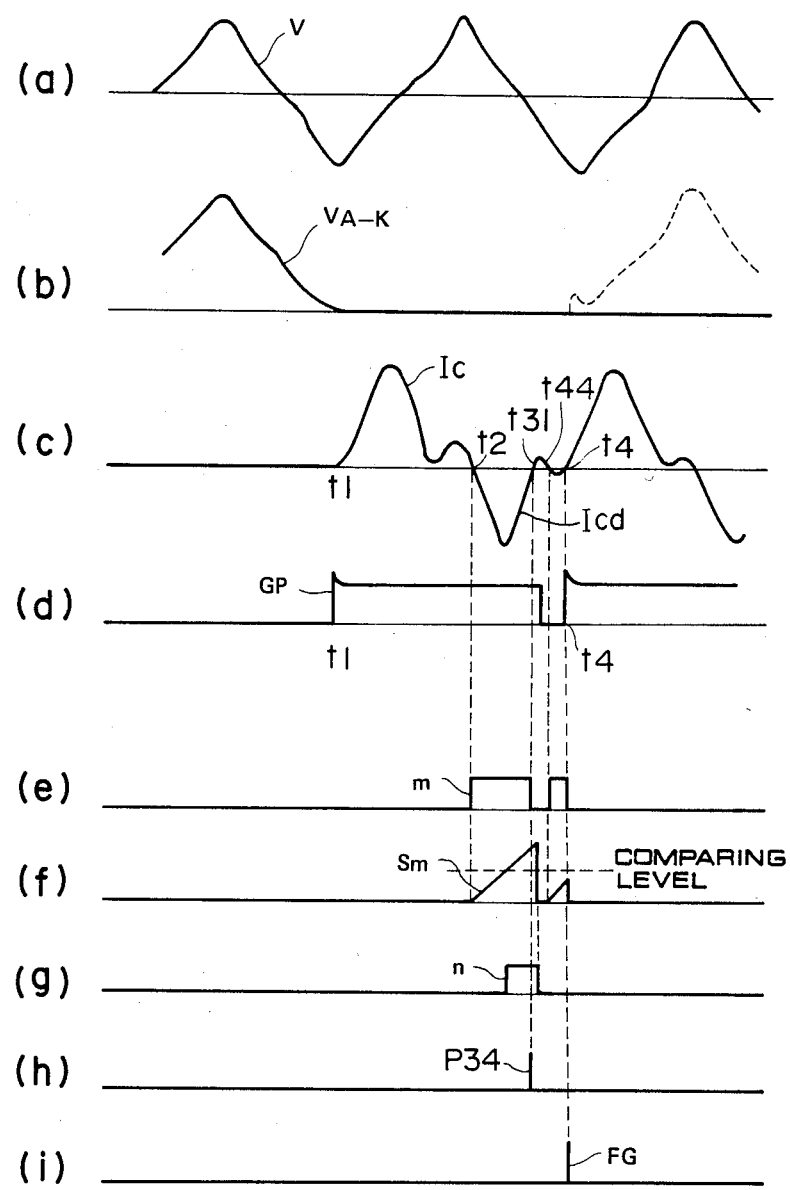
FIG. 13 shows the voltage waveforms of signals in the device of FIG. 12.

In this embodiment, when the capacitor current Ic is distorted as shown in FIG. 13 (c), the conduction period detector 201 sends a detection signal m during the period between $t_2$ and $t_{31}$ and also during the period between $t_{44}$ and $t_4$. Since the period $t_2$–$t_{31}$ is sufficiently longer than the turn-off time $T_{OFF}$, the comparator 302 produces its output after the lapse of the turn-off time $T_{OFF}$ from time $t_2$. This output "1" is inverted by the NOT element 303 to become "0", so that the reignition command signal FG is not sent despite generation of the zero detection pulse P34 from the monostable multivibrator 304 at time $t_{31}$ corresponding to the fall of the detection signal m. However, in case it is as short as the period $t_{44}$–$t_4$ and is shorter than the turn-off time $T_{OFF}$, the detection signal m comes to fall when the output of the comparator 302 is "0" and the output of the NOT element 303 is "1", so that the monostable multivibrator 304 sends its output for feeding the reignition command pulse FG to the gate signal generator 12 at time $t_4$. Consequently, the gate signal GP is applied to the thyristors 8a–8c to eventually prevent withstand voltage breakdown thereof.

The requisite for the circuit consisting of the integrator 301 and the comparator 302 is merely the capability of detecting whether the flow duration of the diode current Icd is longer than a predetermined time and producing an output signal synchronously with the end of such flow duration. As for the detector 201, the requisite is a detecting function synchronized with the beginning and end of the flow duration.

Figure 14:
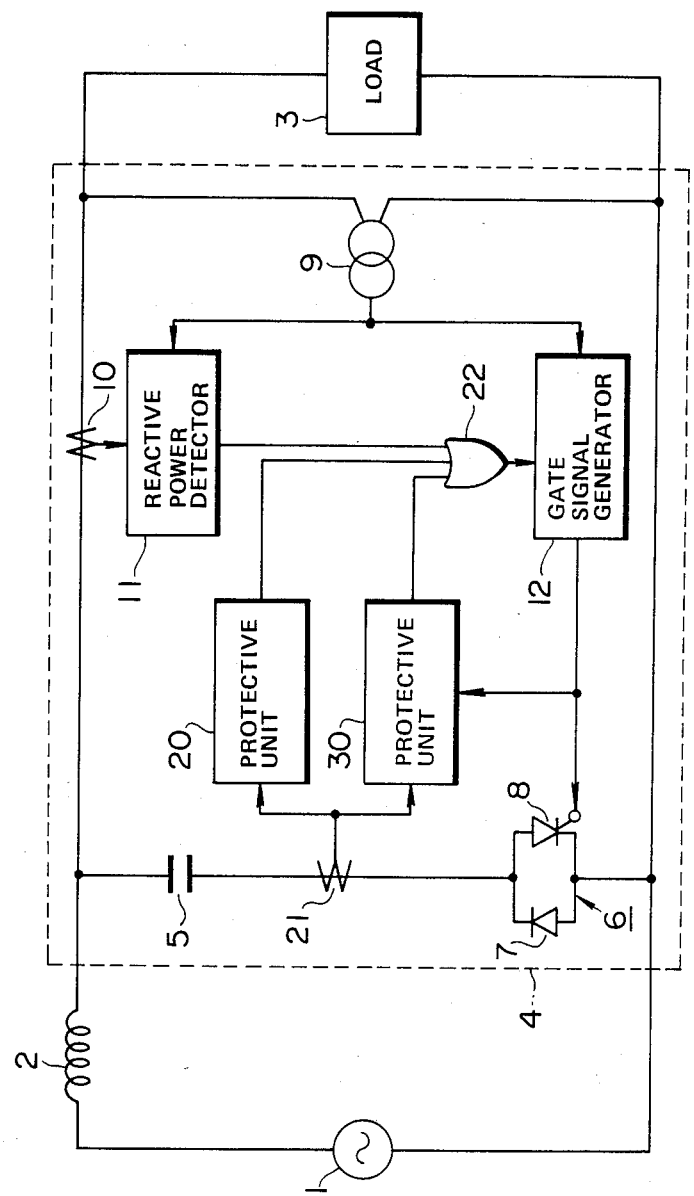
FIG. 14 is a block diagram of a further embodiment of this invention having series connected thyristors.

FIG. 14 shows a further embodiment wherein both protective units 20 and 30 of the foregoing two embodiments are employed to prevent the first and second cases of withstand voltage breakdown. The first protective unit 20 is equivalent to the one shown in FIG. 9, and the second protective unit 30 is equivalent to the one shown in FIG. 12. The respective output signals GF and FG are sent to a gate signal generator 12 via an OR element 22.

In addition to the above embodiments where the series thyristor circuit and the series diode circuit are connected in an antiparallel relationship to each other, it is possible to attain the same effect by employing series thyristors in place of the diode circuit. Furthermore, the diode circuit may consist of a single diode as well.

What is claimed is:

1. A device having series connected thyristors, comprising: a current controller including a series circuit consisting of a plurality of thyristors connected in series, and a reverse-blocking semiconductor element connected to said series circuit in an antiparallel relationship; a gate signal generator for feeding a gate signal to the gate of each of said thyristors; and a thyristor protective unit consisting of a circuit for detecting a zero point of the current flowing in said reverse-blocking semiconductor element and generating a zero detection pulse, a monostable multivibrator for generating a pulse of a predetermined duration synchronously with the time of extinction of said gate signal, an AND element so connected as to receive said two pulses, and means for feeding the output of said AND element as a reignition pulse to said gate signal generator.

2. The device as defined in claim 1, wherein said circuit for generating a zero detection pulse is equipped with a conduction period detector capable of generating an output only during the conduction period of said reverse-blocking semiconductor element, and a monostable multivibrator for generating a zero detection pulse synchronized with the fall of the output of said conduction period detector.

3. A device having series connected thyristors, comprising: a current controller including a series circuit consisting of a plurality of thyristors connected in series, and a reverse-blocking semiconductor element connected to said series circuit in an antiparallel relationship; a gate signal generator for feeding a gate signal to the gate of each of said thyristors; and a thyristor protective unit consisting of a conduction period detector for producing a detection signal merely during the conduction period of said reverse-blocking semiconductor element, comparison means for comparing the duration of the detection signal of said conduction period detector with a predetermined set time and producing an output when the former is shorter than the latter, and means for feeding to said gate signal generator the output of said comparison means as a reignition pulse synchronously with extinction of the detection signal of said conduction period detector.

4. The device as defined in claim 3, wherein said comparison means consists of an integrator for integrating the output signal of said conduction period detector, means resettable at the fall of the detection signal of said conduction period detector, and a comparator for comparing the integral signal of said integrator with a preset reference value.

5. A device having series connected thyristors, comprising: a current controller including a series circuit consisting of a plurality of thyristors connected in series, and a reverse-blocking semiconductor element connected to said series circuit in an antiparallel relationship; a gate signal generator for feeding a gate signal to the gate of each of said thyristors; and first and second protective units for said thyristors, wherein said first protective unit consists of a circuit for detecting a zero point of the current flowing in said reverse-blocking semiconductor element and generating a zero detection pulse, a monostable multivibrator for generating a pulse of a predetermined duration synchronously with the time of extinction of said gate signal, an AND element so connected as to receive said two pulses, and means for feeding the output of said AND element as a reignition pulse to said gate signal generator; and said second protective unit consists of a conduction period detector for producing a detection signal merely during the conduction period of said reverse-blocking semiconductor element, a comparison means for comparing the duration of the output of said conduction period detector with a predetermined set time and producing an output when the former is shorter than the latter, and means for feeding to said gate signal generator the output of said comparison means as a reignition pulse synchronously with extinction of the output signal of said conduction period detector.

* * * * *

UNITED STATES PATENT AND TRADEMARK OFFICE
CERTIFICATE OF CORRECTION

PATENT NO. : 4,540,895
DATED : September 10, 1985
INVENTOR(S) : Masatoshi Takeda It is certified that error appears in the above-identified patent and that said Letters Patent is hereby corrected as shown below:

In the left hand column of the title page, insert:

[30]  Foreign Application Priority Data

May 7, 1982  [JP]  Japan        57-77942

Signed and Sealed this

Fourteenth Day of January 1986

[SEAL]

Attest:

Attesting Officer

DONALD J. QUIGG

Commissioner of Patents and Trademarks